United States Patent
Heise et al.

(10) Patent No.: US 8,374,224 B2
(45) Date of Patent: Feb. 12, 2013

(54) INTERLEAVER APPARATUS AND METHOD

(75) Inventors: Bernd Heise, München (DE); Gert Schedelbeck, München (DE)

(73) Assignee: Lantiq Deutschland GmbH, Neubiberg (DE)

( * ) Notice: Subject to any disclaimer, the term of this patent is extended or adjusted under 35 U.S.C. 154(b) by 1208 days.

(21) Appl. No.: 12/057,460

(22) Filed: Mar. 28, 2008

(65) Prior Publication Data

US 2008/0291984 A1 Nov. 27, 2008

Related U.S. Application Data

(66) Substitute for application No. 60/976,230, filed on Sep. 28, 2007.

(60) Provisional application No. 60/940,021, filed on May 24, 2007.

(51) Int. Cl.
*H04B 1/38* (2006.01)
*H04L 5/16* (2006.01)

(52) U.S. Cl. .......................................... 375/219; 710/1

(58) Field of Classification Search ................... 375/219
See application file for complete search history.

(56) References Cited

U.S. PATENT DOCUMENTS

| | | | |
|---|---|---|---|
| 5,719,875 A | 2/1998 | Wei | |
| 5,838,267 A | 11/1998 | Wang et al. | |
| 5,898,710 A | 4/1999 | Amrany | |
| 5,928,371 A | 7/1999 | Robinson, Jr. et al. | |
| 6,351,832 B1 | 2/2002 | Wei | |
| 6,473,878 B1 | 10/2002 | Wei | |
| 6,628,726 B1 * | 9/2003 | Breiling | 375/260 |
| 6,868,514 B2 * | 3/2005 | Kubo et al. | 714/755 |
| 7,050,458 B1 | 5/2006 | Lifshitz et al. | |
| 7,711,060 B1 * | 5/2010 | Lou et al. | 375/267 |
| 7,802,165 B2 * | 9/2010 | Jain et al. | 714/755 |
| 2003/0105996 A1 | 6/2003 | Dagan et al. | |
| 2003/0128100 A1 * | 7/2003 | Burkhardt et al. | 340/5.8 |
| 2004/0268207 A1 | 12/2004 | Sharma | |
| 2005/0002348 A1 * | 1/2005 | Holtzman et al. | 370/318 |
| 2005/0230487 A1 * | 10/2005 | Lapstun et al. | 235/494 |
| 2006/0268976 A1 * | 11/2006 | Baum et al. | 375/239 |
| 2007/0047633 A1 | 3/2007 | Tung et al. | |
| 2007/0104225 A1 | 5/2007 | Mizuochi et al. | |
| 2008/0065969 A1 * | 3/2008 | Jain et al. | 714/784 |

OTHER PUBLICATIONS

Non-Final Office Action Dated Aug. 31, 2010 for U.S. Appl. No. 12/049,164. 7 Pages.
Notice of Allowance Dated Nov. 1, 2010 for U.S. Appl. No. 12/049,164. 18 Pages.

* cited by examiner

*Primary Examiner* — Erin File
(74) *Attorney, Agent, or Firm* — Eschweller & Associates, LLC (57) ABSTRACT

One embodiment of the invention relates to a method of data processing. In the method, an initial data stream is received. A series of bytes having a total byte length is selected from the initial data stream, the series of bytes having a span in the initial data stream that is greater than the total byte length. At least one redundancy byte is calculated based on the series of bytes. An output data stream is transmitted over a transmission medium, where the output data stream includes the initial data stream with the at least one redundancy byte therein, and where consecutive bytes in the output data stream have an order that corresponds to an order of consecutive bytes in the initial data stream. Other devices and methods are also described.

23 Claims, 13 Drawing Sheets

INTERLEAVER APPARATUS AND METHOD

REFERENCE TO RELATED APPLICATIONS

This application claims the benefit of U.S. Provisional Application No. 60/940,021, filed May 24, 2007, and U.S. Provisional Application No. 60/976,230, filed Sep. 28, 2007; the contents of which provisional applications are herein incorporated by reference in their entirety.

FIELD OF INVENTION

The present invention relates generally to communication systems and more particularly to communication methods using Digital Subscriber Line (DSL).

BACKGROUND OF THE INVENTION

Digital subscriber line (DSL) technology provides high-speed data transfer between two modems across ordinary telephone lines, wherein digital data transfer rates from tens of Kbps to tens of Mbps are supported over standard telephone lines (e.g., twisted pair of copper wires), while still providing for plain old telephone service (POTS). Asynchronous Digital Subscriber Line (ADSL) and Very High Digital Subscriber Line (VDSL) have emerged as popular implementations of DSL systems, where ADSL is defined by American National Standard Institute (ANSI) standard T1.413 and International Telecommunication Union (ITU-T) standards G.992.3, G.992.5, and VDSL is defined by ANSI standard T1.424 and ITU-T standard G.993.1. ADSL, VDSL and other similar DSL systems (collectively referred to as "xDSL") typically provide digital data transfer in a frequency range above the POTS band (e.g., about 300 Hz to 4 kHz), for example ADSL G.992.3 operates at frequencies from about 25 kHz to about 1.1 MHz.

Figure 1:
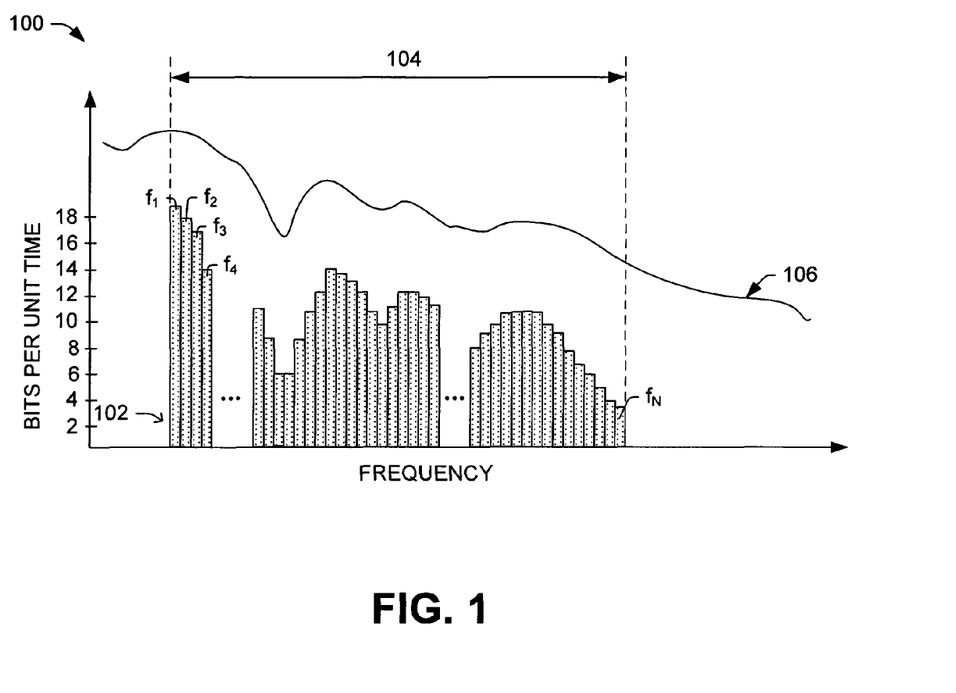
FIG. 1 is a schematic diagram illustrating a DSL communication system where modems communicate data over a multi-carrier channel.

One feature of DSL modems that allows them to provide high data rates is their ability to communicate symbols over a multi-carrier channel 100, such as shown in FIG. 1. The illustrated multi-carrier channel 100 includes a number of frequencies or "carriers" 102 (e.g., carriers $f_1, f_2, \ldots f_N$) that span a frequency spectrum 104 supported by the telephone line. In effect, by breaking the frequency spectrum 104 into multiple carriers, the DSL modems can transmit data over each of the carriers (instead of just a single carrier), thereby allowing them to "stuff" more data through the phone line per unit time.

During communication, a specific number of bits per unit time may be transmitted on each carrier based on a signal-to-noise ratio (SNR) 106. Typically, more bits are transmitted on carriers that have a relatively high SNR, while fewer bits are transmitted on frequencies that have a relatively low SNR. For example, carrier $f_2$ has a relatively high SNR compared to carrier $f_4$. Correspondingly, the DSL modems transmit more bits on carrier $f_2$ (i.e., approximately 18 bits per unit time), and fewer bits on carrier $f_4$ (i.e., approximately 14 bits per unit time). Although encoding and decoding data conveyed on multiple frequencies makes this multi-carrier communication computationally complex, it gives the DSL modems the ability to provide users with high speed data connections with relatively few errors.

Although a multi-carrier channel affords DSL communication systems some ability to account for particularly noisy regions of the frequency spectrum, other components are typically used to account for more dynamic noise sources, such as impulse noise. Therefore, to achieve high data rates with high accuracy, improvements can be made to allow communication systems to communicate more efficiently.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the invention relates to a method of data processing. In the method, an initial data stream is received. A series of bytes having a total byte length is selected from the initial data stream, the series of bytes having a span in the initial data stream that is greater than the total byte length. At least one redundancy byte is calculated based on the series of bytes. An output data stream is transmitted over a transmission medium, where the output data stream includes the initial data stream with the at least one redundancy byte therein, and where consecutive bytes in the output data stream have an order that corresponds to an order of consecutive bytes in the initial data stream. Other devices and methods are also described.

The following description and annexed drawings set forth in detail certain illustrative aspects and implementations of the invention. These are indicative of only a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout. Although some aspects may be discussed below in the context of a DSL communication system, the invention is applicable any type of communication system where interleaving may be employed.

Figure 2:
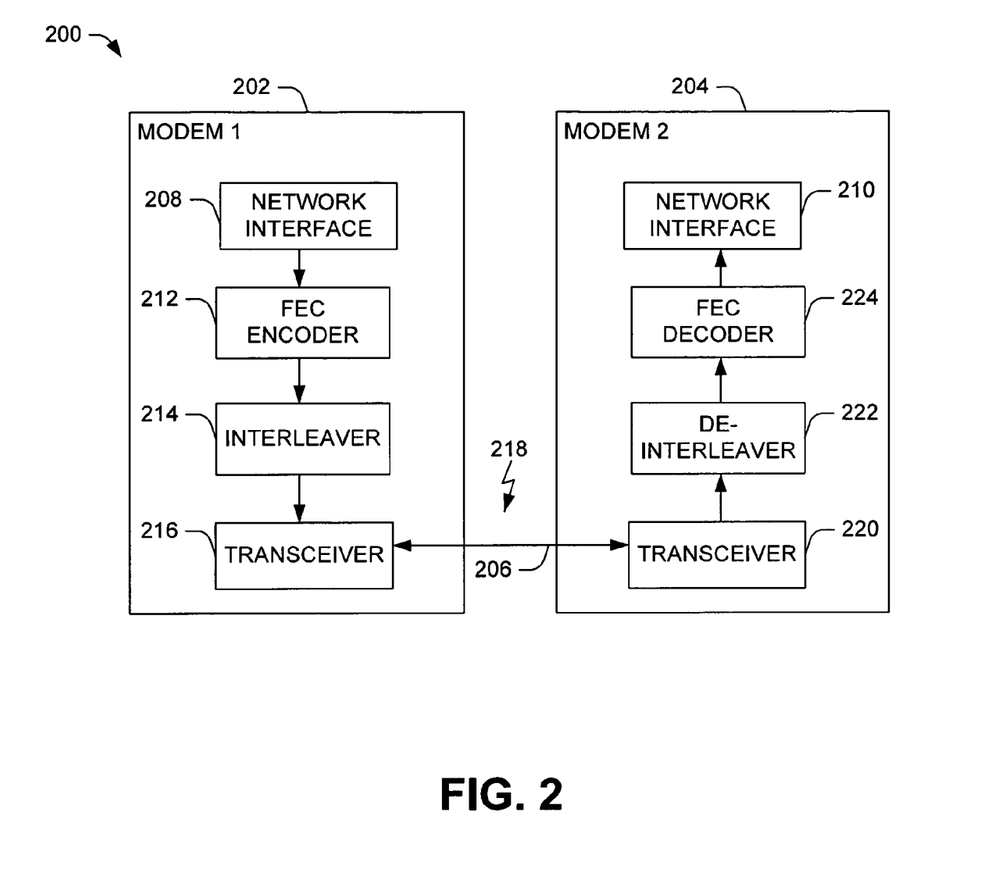
FIG. 2 is a schematic diagram illustrating a DSL communication system with first and second DSL modems that communicate over a twisted pair of copper wires.

FIG. 2 shows a DSL communication system 200 that includes first and second DSL modems 202, 204, respectively, coupled to a standard phone line 206 (e.g., twisted pair of copper wires). As previously mentioned, the DSL modems 202, 204 can transfer data via symbols over a multi-carrier communication channel established over the phone line 206. To exchange data, the modems 202, 204 include network interfaces 208, 210, respectively, that interface to a higher level protocol (e.g., TCP/IP). A brief description of data exchange is now provided with reference to FIG. 2 and a more detailed discussion will follow with reference to FIG. 3.

Referring now to FIG. 2, to transmit data, the transmitting network interface 208 receives payload data and passes it to a forward error correction (FEC) encoder 212, where the FEC encoder appends redundancy bytes to the payload data to form a codeword. An interleaver 214 then interleaves successive codewords with one another to form an interleaved data stream. A transceiver 216 can then modulate the interleaved data stream over the line 206 by applying trellis encoding, inverse Fourier transforms, and the like. Noise 218, such as an impulse noise disturbance, may affect the modulated interleaved data stream on the line 206, potentially corrupting the data.

To receive data, a transceiver 220 in the receiving modem 204 demodulates the modulated interleaved data stream by applying fast Fourier transforms, Trellis decoding, etc. The transceiver 220 then passes the demodulated interleaved data stream to a de-interleaver 222. The de-interleaver 222 then un-mixes the bytes of the interleaved codewords, after which a FEC decoder 224 uses the redundancy bytes to attempt to correct any data errors that occurred on the line 206. Finally, the corrected data is passed to the receiving network interface 210 where it can be used for its desired purpose.

Figure 3:
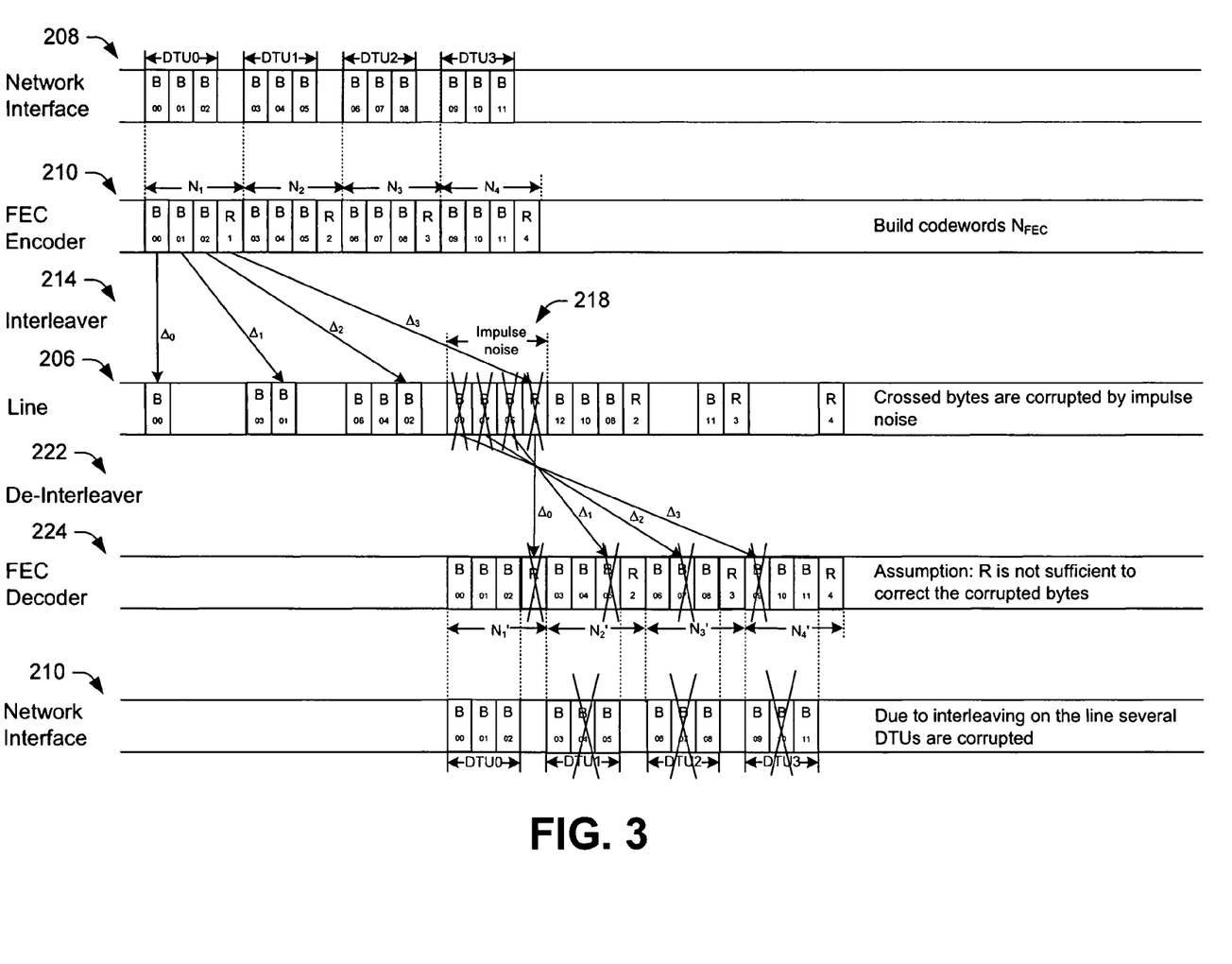
FIG. 3 is a diagram illustrating further how an impulse noise disturbance can cause corrupted data bytes to be distributed over multiple data transmission units in a convolutional interleaver.

In most cases, the FEC encoder 212 and interleaver 214 work in conjunction with the de-interleaver 222 and FEC decoder 224 to reliably correct any corrupted bytes in the payload data. However, in some circumstances the combination of interleaving and redundancy bytes may be insufficient to correct the corrupted bytes. For example, FIG. 3 shows a scenario where four data transmission units (DTUs) are transmitted from network interface 208, three of which are corrupted when received at the network interface 210. These corrupted DTUs are due to an impulse noise event 218 that has a duration that exceeds the minimum impulse noise protection ($INP_{min}$) of the system. Due to the interleaving, these corrupted data bytes are spread across multiple DTUs at the network interface 210.

More specifically, in FIG. 3's example, one can see that the transmitting network interface 208 supplies several DTUs (DTU0, DTU1, DTU2, DTU3), where each DTU includes three bytes (B) of payload data. The FEC encoder 210 then calculates one redundancy byte (R) for each DTU and appends the redundancy byte that DTU to form a codeword having a codeword size (N) of 4 bytes. For example, codeword $N_1$ includes DTU0's payload bytes $B_{00}$, $B_{01}$, and $B_{02}$, as well as redundancy byte $R_1$, which is calculated from DTU0's payload bytes. The codeword $N_1$ is then spread in time using the interleaver 214, after which transceiver 216 transmits the interleaved codewords over the line 206. In this example for the sake of simplicity, symbols are framed so that each codeword is transmitted as a single symbol on the line.

An impulse noise disturbance 218 occurs on the line 206, as indicated by the crossed-out bytes. As can be seen, the impulse noise disturbance 218 corrupts all the data in a single symbol or consecutive symbols. Thus, in FIG. 3's example, the impulse noise disturbance 218 corrupts a single codeword, which includes three payload bytes ($B_{09}$, $B_{07}$, $B_{05}$) and one redundancy byte ($R_1$).

In the receiving modem, transceiver 220 demodulates the data from the line 206 and the de-interleaver 222 de-interleaves received data, resulting in the codewords ($N_1'$, $N_2'$, $N_3'$, $N_4'$). The FEC decoder 224 then calculates redundancy bytes based on received payload bytes, which may or may not be equal to the transmitted payload bytes due to noise 218 on the line. If the redundancy bytes calculated by the FEC decoder are not equal to the received redundancy bytes, the FEC decoder 224 can use the redundancy bytes in a given codeword to attempt to correct the corrupted bytes. Thus, redundancy byte $R_1$ would typically be used to correct any errors that occur in payload bytes $B_{00}$, $B_{01}$, and $B_{02}$. However, as clearly seen, if R is insufficient to correct the corrupted bytes, three of the four DTUs are corrupted due to the impulse noise disturbance 218.

If the redundancy bytes cannot correct the errors in payload data, typical higher layer protocols (e.g., TCP/IP), must retransmit each corrupted DTU. This flood of retransmission requests may, in some cases, overload the retransmission capabilities of the servers and result in non-corrected errors in the network.

Figure 4:
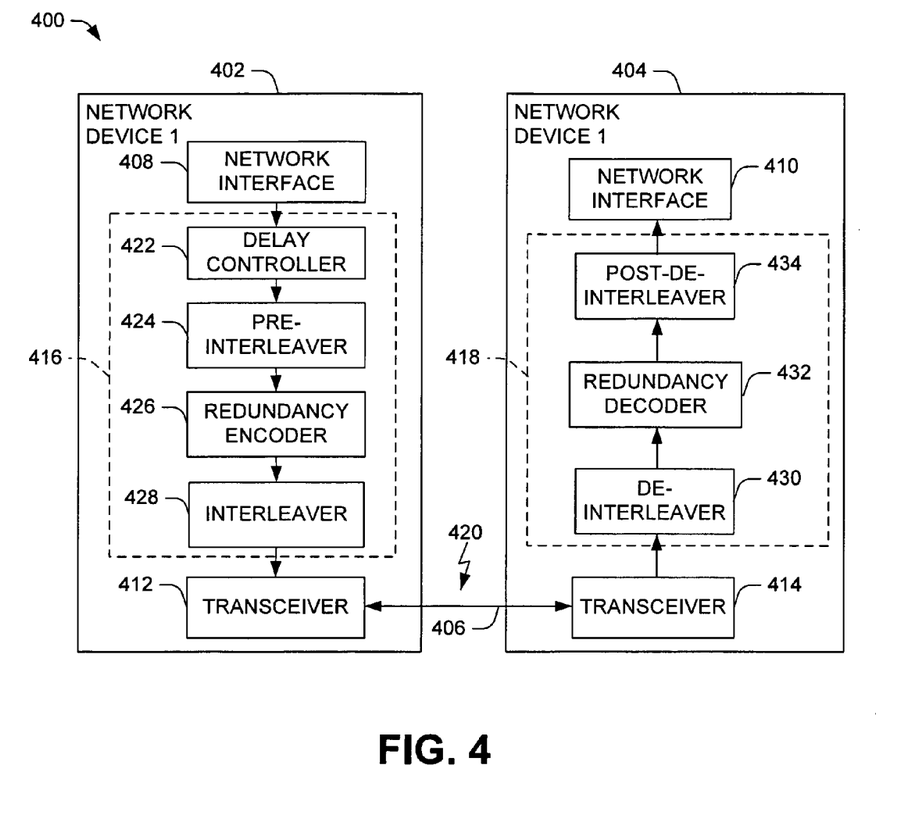
FIG. 4 is a schematic diagram illustrating another embodiment of a communication system with first and second network devices coupled to a transmission medium.

In appreciating the above problems or limitations associated with some interleaver systems and methods, the inventors have developed interleaver systems and methods that, together with redundancy coding, limit the number of DTUs corrupted over the network. FIG. 4 shows one embodiment of such a communication system 400 that includes first and second network devices 402, 404, respectively, coupled to a transmission medium 406. In one embodiment the network devices 402, 404 could comprise DSL modems that communicate over a multi-carrier channel supported by a standard phone line. In other embodiments, however, the network devices 402, 404 could comprise other network devices, such as cellular phones, pagers, laptops, etc., that communicate over a wireline or wireless transmission medium.

Like the previously discussed DSL modems 202, 204, the network devices 402, 404 may include network interfaces 408, 410, respectively, that may interface to a higher level protocol. The network devices 402, 404 may also include transceivers 412, 414, respectively, that are configured to transmit and/or receive information over the transmission medium 406.

Unlike the previously described DSL modems, however, the network devices 402, 404 also include an interleaving redundancy encoder 416 and a de-interleaving redundancy decoder 418. Notably, the interleaving redundancy encoder 416 is configured to receive an initial data stream of payload bytes from the transmitting network interface 408 and facilitate transmission of an output data stream over the transmission medium 406, where the output data stream has the same or similar order as the initial data stream. Under this condition, if noise 420 corrupts consecutive symbols on the transmission medium 406, the corruption will be confined to a limited number of DTUs rather than spread over numerous DTUs. In FIG. 4's embodiment, the interleaving redundancy encoder 416 includes an optional delay controller 422, a pre-interleaver 424, a redundancy encoder 426, and an interleaver 428; while the de-interleaving redundancy decoder 418 includes a de-interleaver 430, a redundancy decoder 432, and a post-deinterleaver 434.

The delay controller 422, which could be a timing element, switch, memory buffer, or some other type of controller, could receive an initial data stream from the network interface 408 and insert delays (e.g., dummy bytes) therein to form a modified data stream, if necessary. In some embodiments, the delay controller 422 could be included in a higher level protocol that provides the initial data stream to the network interface 408.

Figure 5:
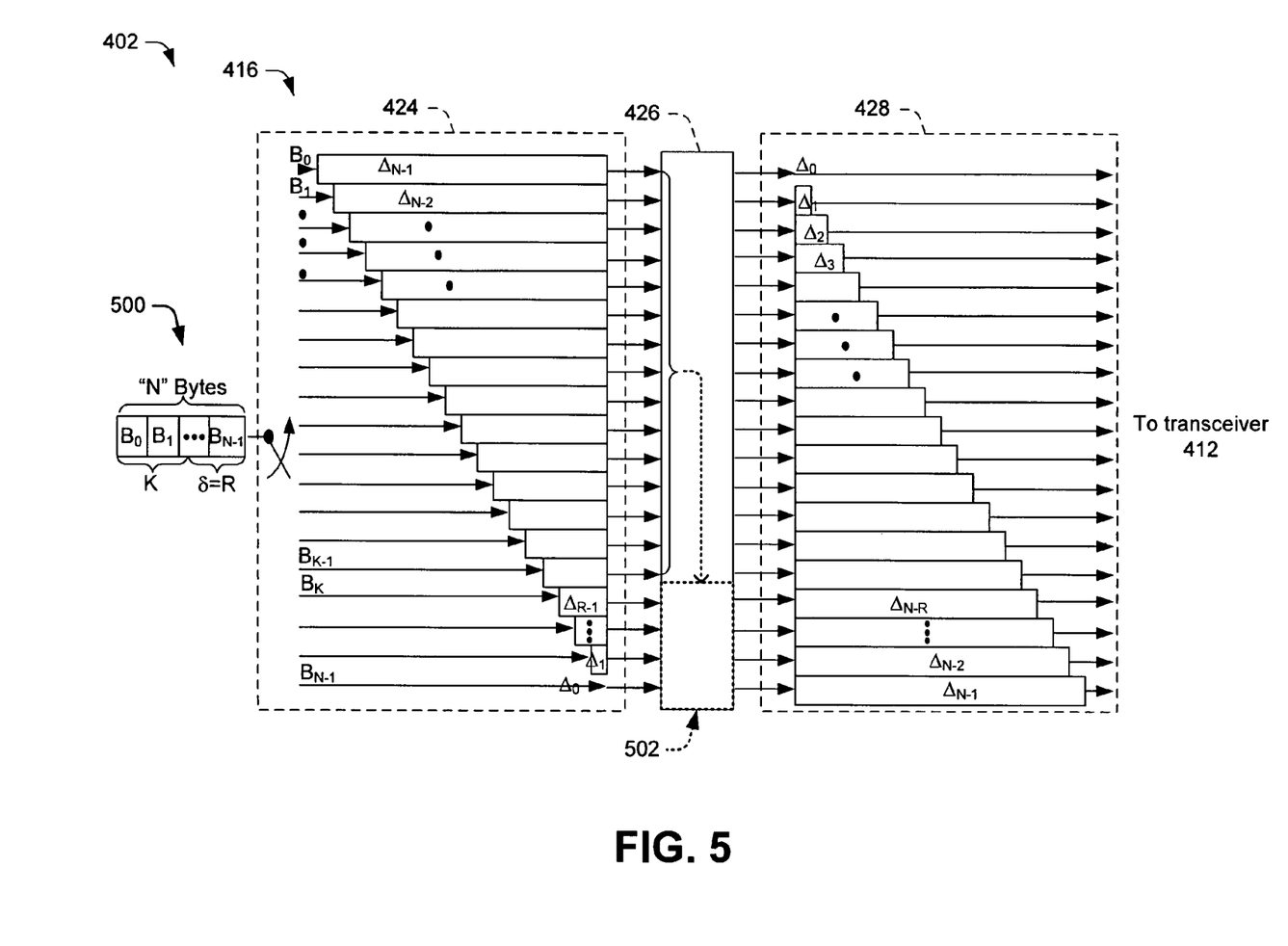
FIG. 5 is a schematic diagram illustrating an embodiment of a network transmitting device with an interleaving redundancy encoder that includes a pre-interleaver, a redundancy encoder, and an interleaver.

FIG. 5 illustrates a more detailed view of the interleaving redundancy encoder 416, which includes a pre-interleaver 424, a redundancy encoder 426, and an interleaver 428 as mentioned. In one embodiment, the pre-interleaver 424 comprises a structure configured to perform an interleaving operation on an initial or modified data stream 500. As will be further appreciated, in various embodiments the initial data stream 500 comprises a stream of DTUs, each of which comprises K bytes of payload data. Delays δ, such as dummy bytes, are also included in the initial or modified data stream 500. The dummy bytes operate to delay the payload bytes so that an input codeword length N is K+R, where R represents the number of redundancy bytes that will be used per codeword.

In FIG. 5's embodiment, the pre-interleaver 424 is configured as a de-interleaver type structure, wherein each payload byte is delayed according to:

$$\Delta(j)=(D-1)\times(N-j-1); j=0, 1, \ldots (N-1-R),$$

wherein D is the pre-interleaver depth, and N is the codeword length.

The redundancy encoder 426 receives a series of K payload bytes, which are now pre-interleaved, and calculates a number R of redundancy bytes 502 for the series of K data bytes. The redundancy bytes 502 are appended to the K payload data bytes to form a virtual data stream of virtual codewords, where each virtual codeword has length K+R. In one embodiment, the redundancy encoder 426 uses a Reed-Solomon coding technique to generate the redundancy bytes 502, however, other redundancy coding techniques may be employed and are contemplated as falling within the scope of the present invention.

The interleaver 428 then receives the virtual data stream and delays each byte of the virtual codewords according to an algorithm. In one embodiment, each byte is delayed according to:

$$\Delta(j)=(D-1)\times j; j=0, 1, \ldots (N-1).$$

As stated above, in one embodiment the virtual codewords from the redundancy encoder 426 have each byte delayed according to the above formula, which causes the output data stream transmitted on the transmission medium 406 to have the payload bytes in the same order as they were at the network interface 408.

Figure 6:
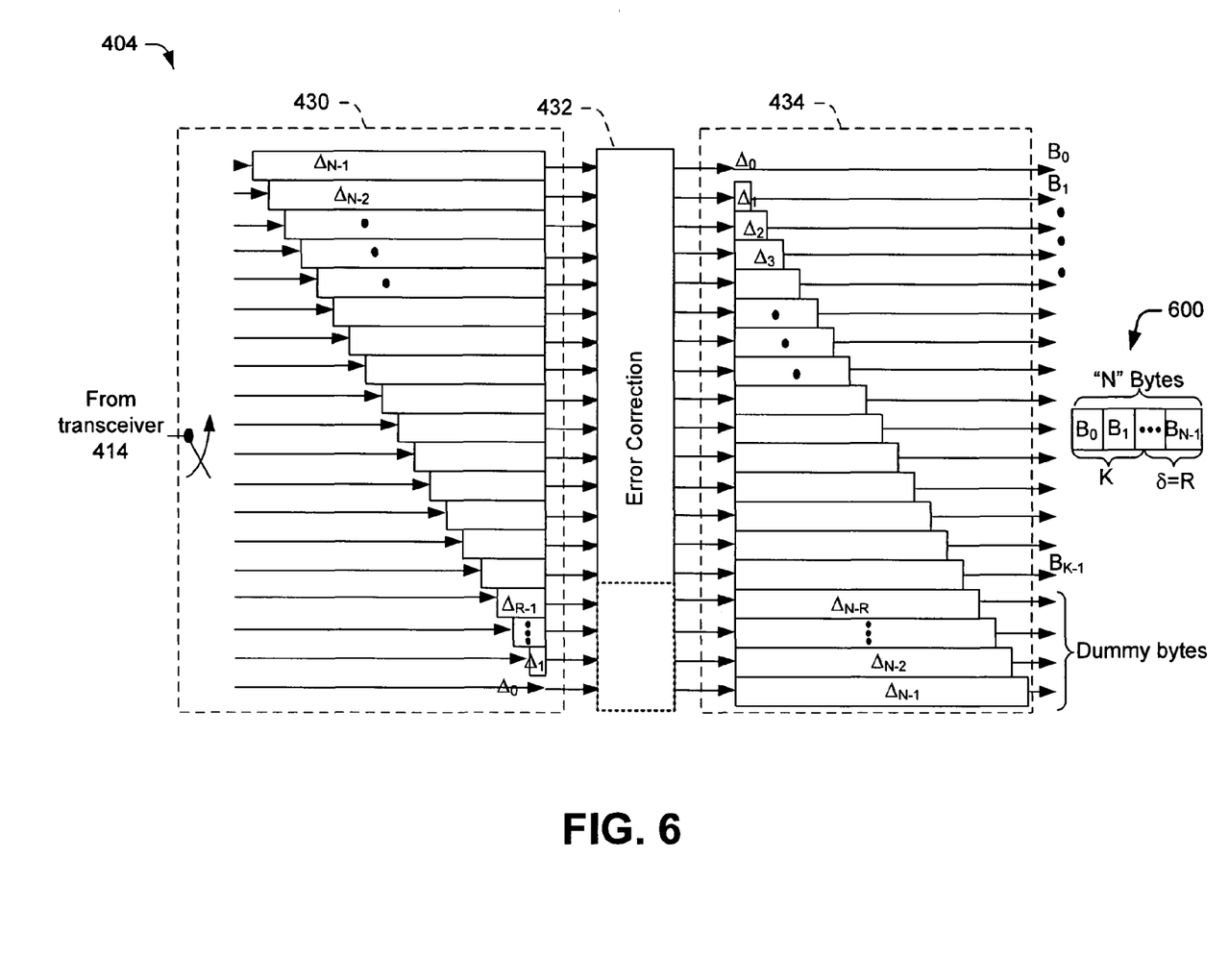
FIG. 6 is a schematic diagram illustrating an embodiment of a network receiving device with a de-interleaver, a redundancy decoder, and a post de-interleaver according to one embodiment of the invention.

After the DTUs have been transmitted over the transmission medium 406 by the transmitting network device 402, the receiving network device 404 receives the data stream from the transmission medium and can process the data as shown in FIG. 6. As previously mentioned, the receiving network device 404 can include a de-interleaver 430, a redundancy decoder 432, and a post de-interleaver 434.

The de-interleaver 430 receives the transmitted output data stream from the transmission medium 406 and delays each byte therein, in one embodiment, according to:

$$\Delta(j)=(D-1)\times(N-j-1); j=0, 1, \ldots (N-1).$$

After de-interleaving, the redundancy decoder 432 receives the de-interleaved data (i.e., delayed and thus spread among numerous virtual codewords). The redundancy decoder 432 then performs error correction based on the redundancy bytes provided therein. In one embodiment the error correction of component is performed based on Reed-Solomon coding, however, the error correction may vary for other redundancy coding techniques, and all such variations are contemplated as falling within the scope of the present invention.

Since the redundancy bytes R are no longer needed after the error correction, the redundancy bytes R can be dropped and the corrected codewords having length K are then input to the post de-interleaver 434. The corrected payload data bytes could be input into the post de-interleaver 434 along with δ dummy bytes so that the K corrected bytes are delayed as if there were K+R bytes in a codeword. Consequently, each of the corrected data bytes is delayed by an amount:

$$\Delta(j)=(D-1)\times j; j=0, 1, \ldots (N-1-R).$$

The resultant data stream 600 is output from the post de-interleaver 434, and the dummy bytes can be dropped.

A substantial advantage of the system 400 is that non-correctable errors are spread over a limited number of DTUs. This advantageous result may be more fully appreciated in conjunction with FIG. 7 and the discussion below. For the sake of simplicity and clarity, symbols are framed to correspond to a single virtual codeword, although in general symbols could be framed in other manners.

Figure 7:
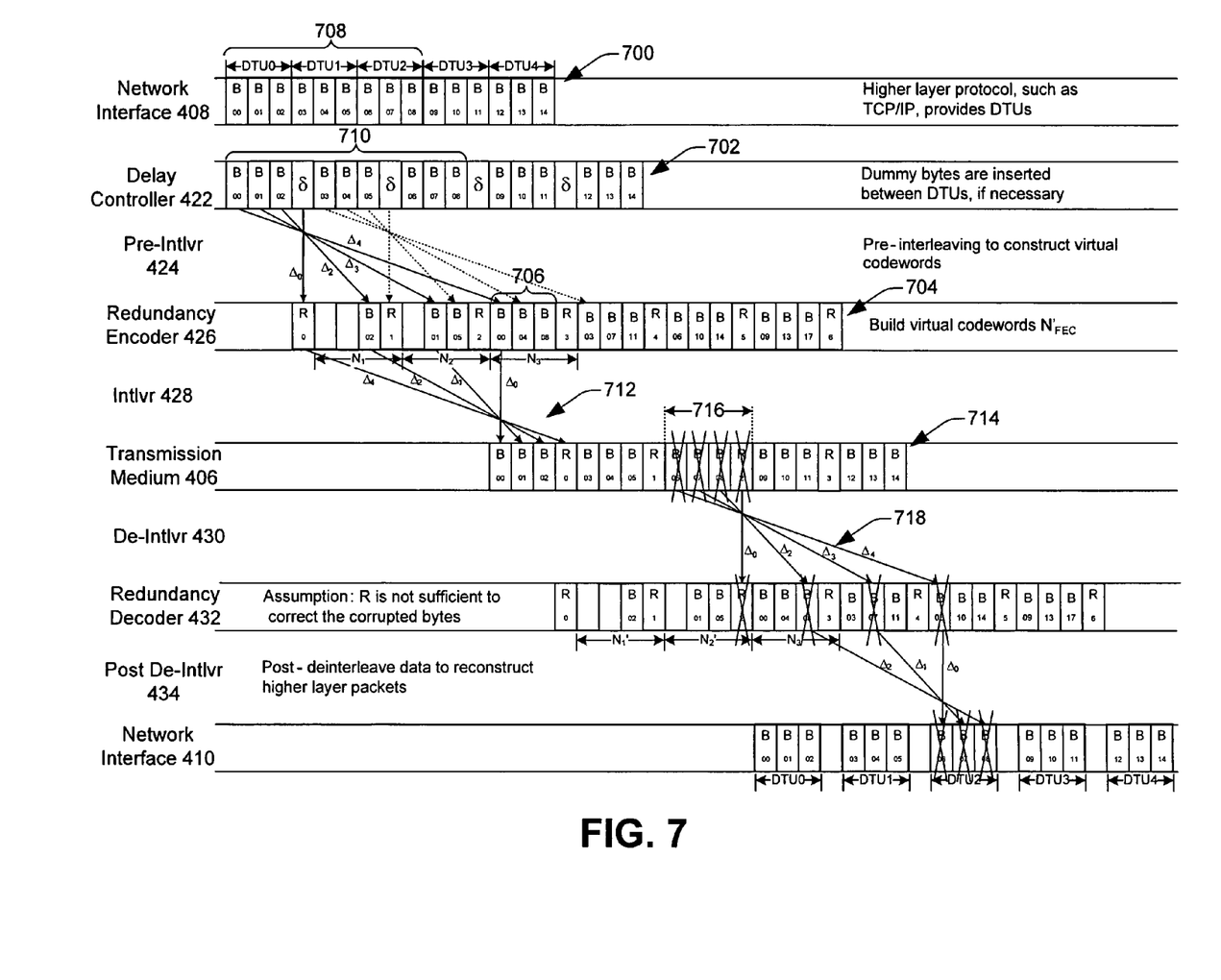
FIG. 7 is a diagram illustrating how a pre-interleaver in conjunction with a post de-interleaver can prevent an impulse noise disturbance from being spread over multiple data transmission units according to one embodiment of the invention.

As shown in FIG. 7, the transmitting network interface 408 receives an initial data stream 700 that includes a series of payload bytes (B) arranged in DTUs. If necessary, the delay controller 422 introduces dummy bytes 6 into the initial data stream 700 to form a modified data stream 702. The pre-interleaver 424 then builds a virtual data stream 704 by spreading the bytes from each DTU, where earlier bytes of a DTU are delayed by a greater amount ($\Delta_4$) and later bytes of a DTU are delayed by a lesser amount ($\Delta_0$). The redundancy encoder 426 then calculates at least one redundancy byte based on series of bytes in the virtual data stream, thereby generating "virtual" codewords ($N_1$, $N_2$, $N_3$) of size N=K+R. Typically, each series of bytes has a total byte length that is less than the span of the series of bytes in the initial and modified data streams. For example, virtual codeword $N_3$ includes a series of bytes 706 (i.e., $B_{00}$, $B_{04}$, $B_{08}$) that has a total byte length of three bytes and a span 708 of approximately eight bytes in the initial data stream 700. Redundancy byte $R_{03}$ is calculated based on the series of bytes ($B_{00}$, $B_{04}$, $B_{08}$), and could be associated with these bytes to form the virtual codeword $N_3$. The series of bytes ($B_{00}$, $B_{04}$, $B_{08}$) also has a span 710 of approximately ten bytes in the modified data stream 702.

The interleaver 428 then interleaves the virtual codewords at 712 such that the outgoing data stream 714 transmitted on the transmission medium 406 is in the same order as the initial data stream 700, albeit with the redundancy bytes R inserted therein. Thus, one can see that the virtual codewords $N_1$, $N_2$, $N_3$ may be "virtual" in the sense that redundancy bytes are calculated over their payload bytes, but the virtual codewords themselves are not transmitted over the transmission medium 406.

On the transmission medium 406, an impulse noise disturbance 716 causes bytes to be corrupted.

At the receiving network device, the received data is passed through the de-interleaver 430 at 718 to reconstruct virtual codewords $N_1'$, $N_2'$, $N_3'$. The redundancy decoder 432 can check the redundancy bytes for each received virtual codeword. If the redundancy bytes are unable to correct all of the corrupted bytes, then the redundancy decoder 432 does not correct the errors, and corrupted bytes enter the post de-interleaver 434. The corrupted bytes are then re-ordered by the post de-interleaver 434 so that each of the corrupted bytes reside within a limited number of DTUs. Consequently, in the illustrated embodiment, only one of the four illustrated DTUs will need to be retransmitted.

Figure 8:
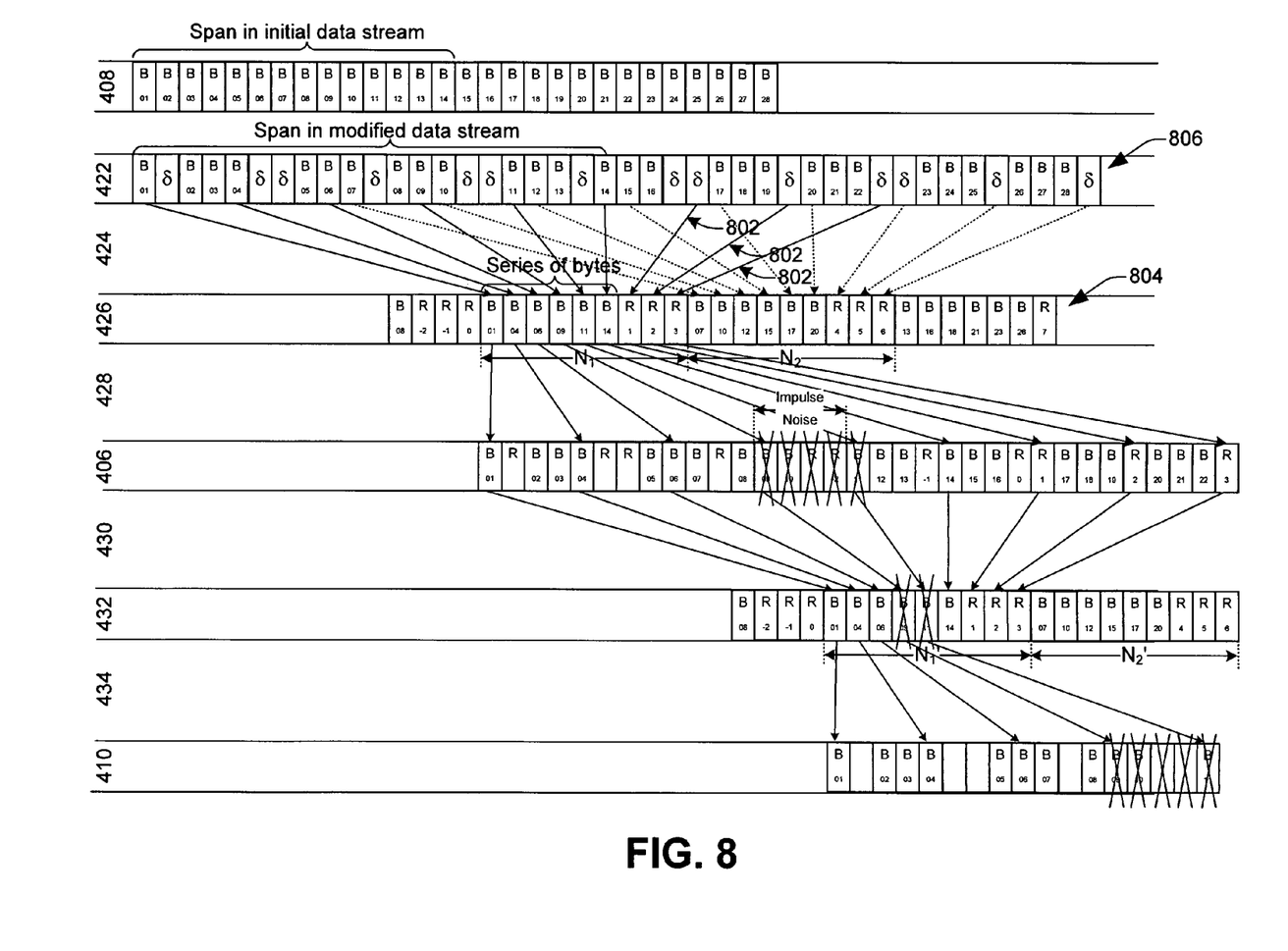
FIG. 8 is another diagram illustrating how a pre-interleaver in conjunction with a post de-interleaver can prevent an impulse noise disturbance from being spread over multiple data transmission units according to one embodiment of the invention.

FIG. 8 shows another example of how data can be communicated in a manner that prevents an impulse noise disturbance from being spread over multiple DTUs. More particularly, in this example, multiple redundancy bytes are associated with each virtual codeword. For example, virtual codeword $N_1$ includes six payload bytes (B01, B04, B06, B09, B11, B14) and three redundancy bytes (R1, R2, R3). Notably, in this embodiment, there may be negative delays 802, wherein the redundancy bytes are calculated from a series of bytes in the virtual data stream 804 before the associated delay unit in the modified data stream 806 arrives.

Figure 9:
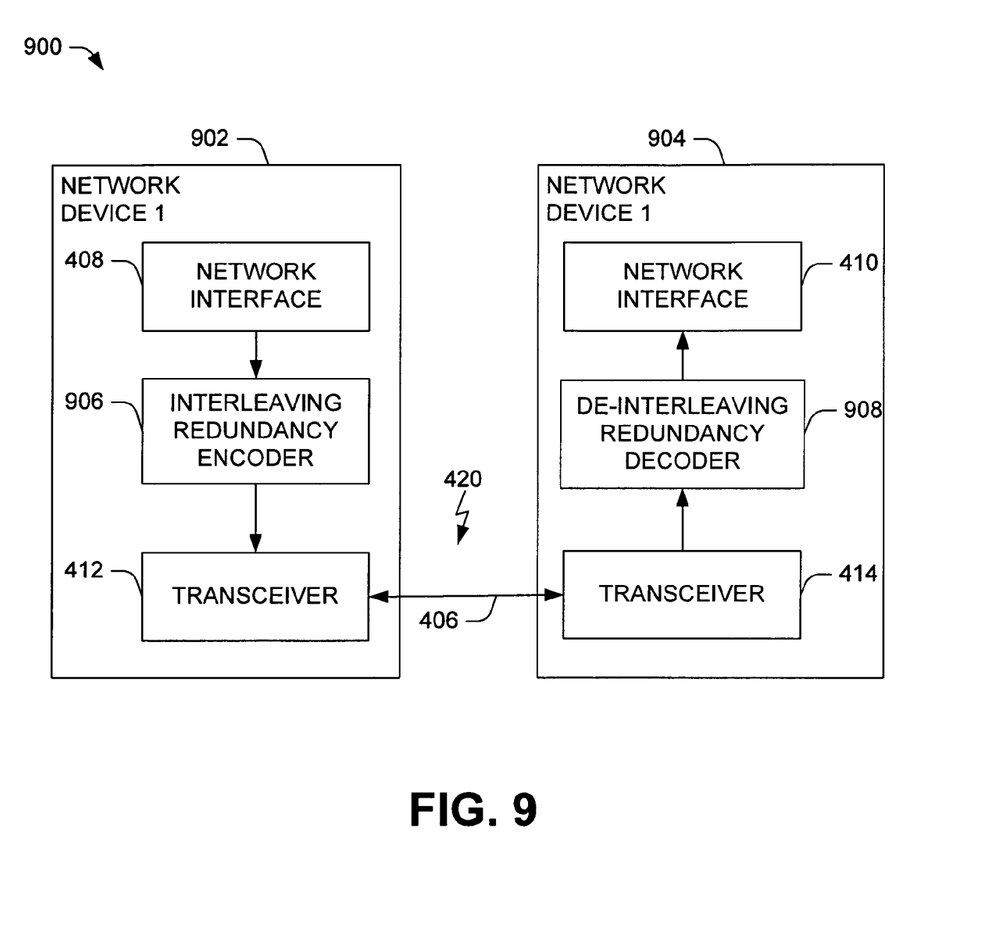
FIG. 9 is a schematic diagram illustrating a communication system with first and second network devices coupled to a transmission medium in accordance with aspects of the present invention.

Turning now to FIG. 9, one can see another embodiment of a communication system 900 that includes first and second network devices 902, 904, respectively, coupled to a transmission medium 406. Like the previous embodiments, the network devices 902, 904 include network interfaces 408, 410, respectively, and transceivers 412, 414, respectively. However, in this embodiment, the interleaving redundancy encoder 906 and de-interleaving redundancy decoder 908 may include various optimizations from previously discussed examples. For example, in some optimizations, the initial or modified data stream may be passed directly from the network interface 408 to the transceiver 412. Similarly, and the received data stream from the transmission medium 406 may be passed directly from the transceiver 414 to the network interface 410. By optimizing these components, their footprints are reduced and the overall performance of the system may be improved.

To highlight some of this functionality, FIGS. 10A-10F show a more detailed embodiment of how an initial data stream 1000 could be loaded into the interleaving redundancy encoder 906 in time, and processed to form a virtual data stream 1002. In these figures, the interleaving redundancy encoder 906 includes several delay elements 1004, such as FIFOs, and may be arranged in the form of a convolutional interleaver as shown.

Figure 10A:
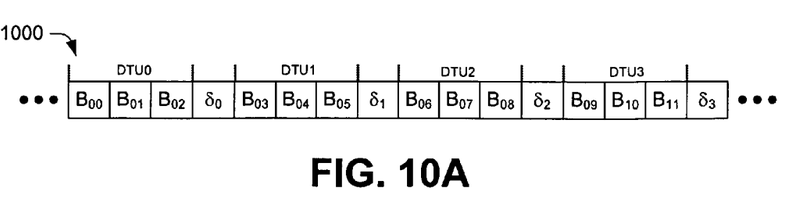
FIGS. 10A-10F are schematic diagrams illustrating functionality of one embodiment of an interleaving redundancy encoder.
Figure 10B:
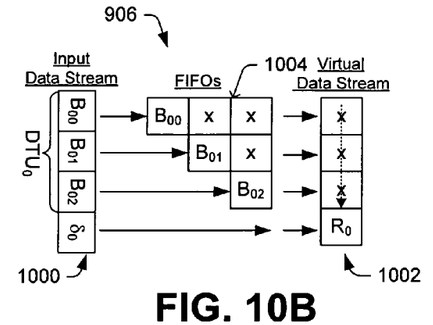

FIG. 10A shows several the initial data stream 1000 as a series of DTUs ($DTU_0$, $DTU_1$, $DTU_2$, $DTU_3$) with time delays δ between successive DTUs. A higher level protocol could structure the initial data stream 1000 with suitable time delays δ, or a delay controller in the interleaving redundancy encoder 906 could insert the delays δ. In this example we assume that there will be one redundancy byte per virtual codeword and consequently there is one dummy byte between consecutive DTUs (e.g., dummy byte $δ_0$ is inserted between $DTU_0$ and $DTU_1$), however, in other examples multiple redundancy bytes per virtual codeword could be used.

Although FIG. 10A's example shows DTUs that have 3 bytes, DTUs may in general comprise any number of bits or bytes, and different DTUs may have different lengths.

Figure 10C:
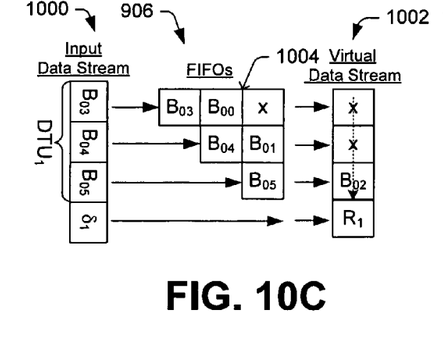
Figure 10D:
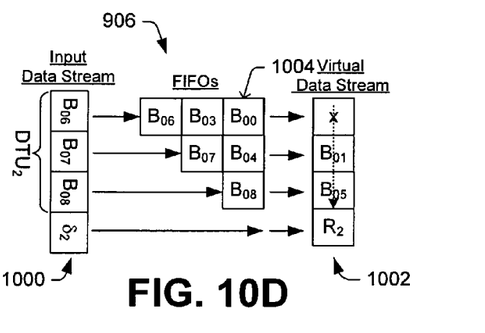
Figure 10E:
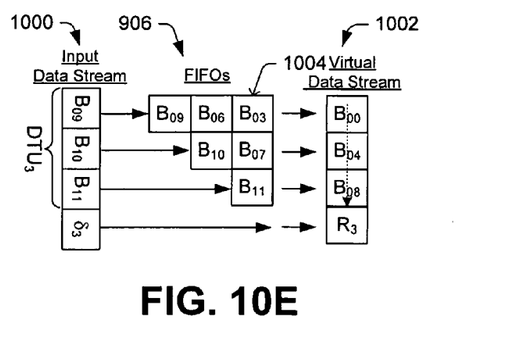
Figure 10F:
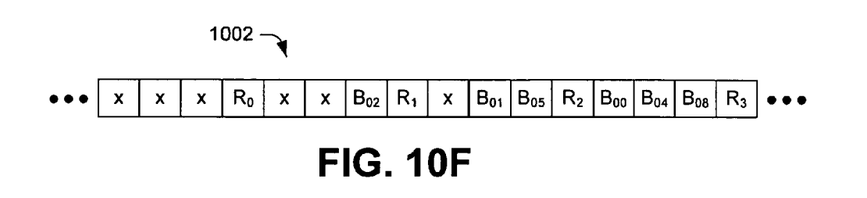

In FIG. 10B-10E, the DTUs are successively loaded onto delay elements 1004 (e.g., FIFOs) of the interleaving redundancy encoder 906 to achieve the desired virtual data stream 1002. As each successive byte of the initial data stream 1000 is loaded onto the front of each FIFO, a byte simultaneously pops from the back of that FIFO into the virtual data stream 1002. For example, in FIG. 10B, payload byte $B_{00}$ is first loaded onto the FIFO with the longest delay, thereby popping the first "don't care" byte (X) into the virtual data stream. Next, the controller loads $B_{01}$ onto the second FIFO, after which it loads $B_{02}$ onto the third FIFO. Finally, after each DTU is loaded, the interleaving redundancy encoder could calculate a redundancy byte, such as a Reed-Solomon redundancy byte, for the series of bytes in the virtual data stream. Thus, in FIG. 10B, redundancy byte $R_0$ is calculated based on three "don't care" bytes as shown. FIG. 10C shows $DTU_1$ being loaded into the FIFOs, and consequently advancing the existing bytes through the FIFOs. FIGS. 10D and 10E show similar functionality for $DTU_2$ and $DTU_3$. FIG. 10F shows the resultant virtual data stream 1002 formed in this manner.

A substantial advantage of the system 900 is that non-correctable errors are spread over a limited number of DTUs, but with a limited delay relative to previous embodiments. This advantageous result may be more fully appreciated in conjunction with FIG. 11 and the discussion below. For the sake of simplicity and clarity, FIG. 11's example has been chosen to be consistent with FIG. 10. However, FIG. 10 merely illustrates one way of implementing the interleaving redundancy encoder 906 and other embodiments could also achieve FIG. 11's characteristics. Further, for the sake of simplicity and clarity, symbols are framed to correspond to a single virtual codeword, although in general they could be framed in other manners.

Figure 11:
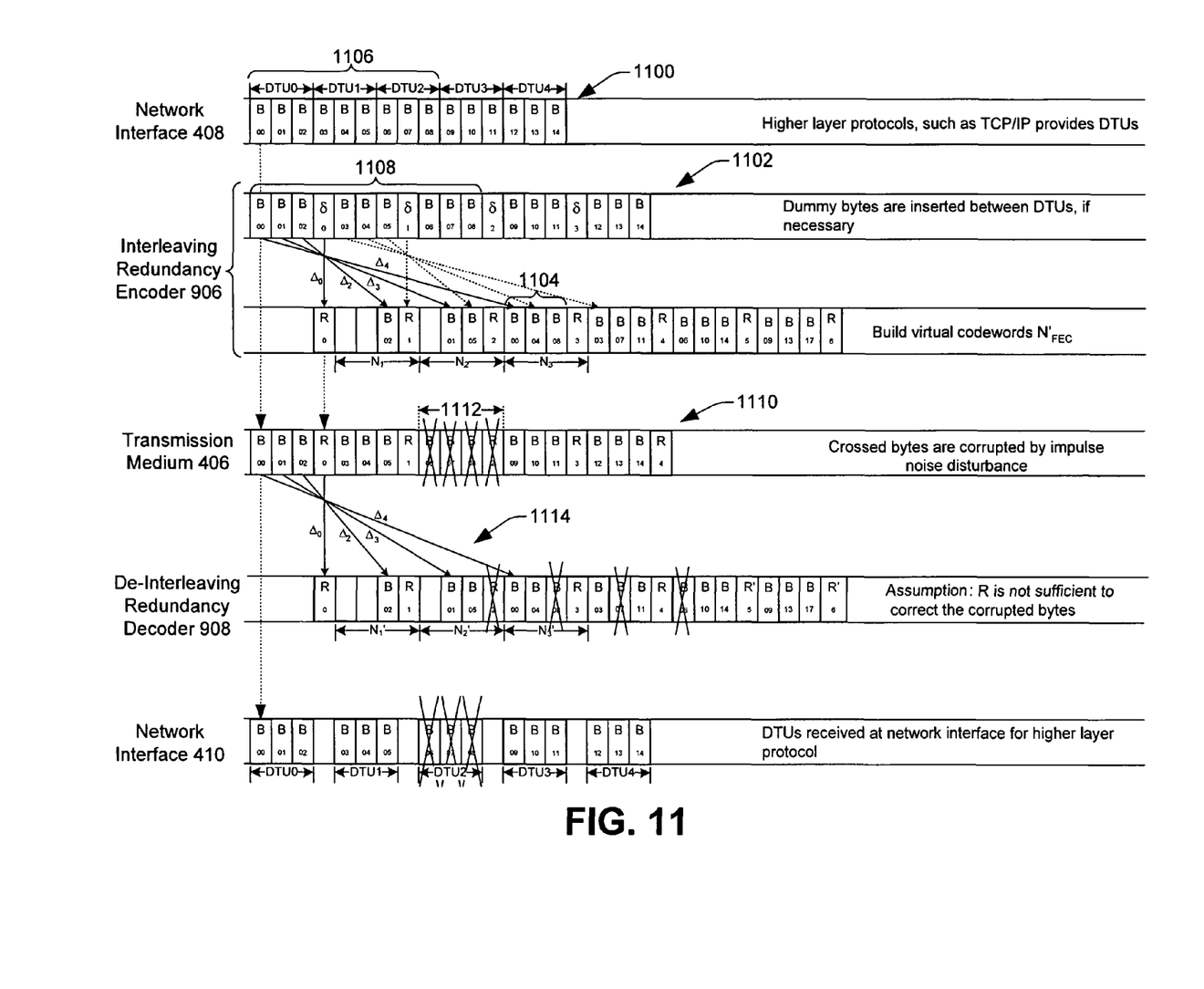
FIG. 11 is a diagram illustrating how an interleaving redundancy encoder in conjunction with a de-interleaving redundancy de-coder can prevent an impulse noise disturbance from being spread over multiple data transmission units according to one embodiment of the invention.

As shown in FIG. 11, the transmitting network interface 408 receives an initial data stream 1100 of payload bytes (B) as a series of DTUs. In the interleaving redundancy encoder 906, delays 6 could be inserted to form a modified data stream 1102 (or these delays could also be provided at the network interface 408 by a higher level protocol). The interleaving redundancy encoder 906 then selects series of payload bytes 1104 from the initial or modified data streams and calculates at least one redundancy byte (R), such as a Reed-Solomon redundancy byte, for each series of bytes. As shown, the redundancy bytes are associated with the series of bytes to form the virtual codewords $N_1$, $N_2$, $N_3$. Typically, each series of bytes has a total byte length that is less than the span of the series of bytes in the initial and modified data streams. For example, virtual codeword $N_3$ includes a series of bytes 1104 (i.e., $B_{00}$, $B_{04}$, $B_{08}$) that has a total byte length of three bytes and a span 1106 of approximately eight bytes in the initial data stream 1100. Redundancy byte $R_{03}$ is then calculated based on the series of bytes ($B_{00}$, $B_{04}$, $B_{08}$), and could be associated with these bytes to form the virtual codeword $N_3$. The series of bytes 1104 also has a span 1108 of approximately fourteen bytes in the modified data stream 1102.

In the illustrated embodiment, the interleaving redundancy encoder 906 could forward the initial data stream 1100 with redundancy bytes inserted therein for transmission onto the transmission medium 406. Because the payload data is in the same order, the initial data stream could be forwarded with zero effective delay (notwithstanding physical delays in the transmitter due to modulation, calculation of redundancy bytes, etc.) The transceiver can then frame the outgoing data stream as a series of symbols, and transmit an output data stream 1110 over the transmission medium 406, where bytes in the output data stream 1110 have the same order as the initial data stream 1000.

When the output data stream has been transmitted on the transmission medium 406, an impulse noise disturbance 1112 could cause all data in a single symbol or several consecutive symbols to be corrupted.

After demodulation at the receiver side, the received payload bytes could be passed directly to the receiving network interface 410 because the received payload bytes are in the desired order. Therefore, the initial data stream 1100 could be transmitted from network interface 408 to network interface 410 with zero effective delay (notwithstanding physical delays in the transmitter due to modulation, calculation of redundancy bytes, etc.) This is advantageous in that it may reduce delay and latency over other communication systems.

To facilitate error correction, the received payload bytes are also passed to the de-interleaving redundancy decoder 908. The de-interleaving redundancy decoder 908 then reconstructs 1114 the virtual codewords $N_1'$, $N_2'$, and $N_3'$ and calculates redundancy bytes R' based on the received payload bytes, which may or may not be equal to the transmitted payload bytes due to noise on the transmission medium. If the calculated redundancy bytes R' are not equal to the received redundancy bytes R, the de-interleaving redundancy decoder 908 can attempt to use the received redundancy bytes R associated with a given virtual codeword to correct the corrupted bytes. Thus, redundancy byte $R_{03}'$ would typically be used to correct any errors that occur in payload bytes $B_{00}$, $B_{04}$, and $B_{08}$.

If we assume that the received redundancy bytes are unable to correct all of the corrupted bytes, then the de-interleaving redundancy decoder 908 can not correct the errors. However, due to the fact that the payload data was transmitted over the transmission medium 406 in the same order as used at the network interfaces 408, 410, the corrupted bytes reside within a limited number of DTUs. Consequently, in the illustrated embodiment, a higher level protocol only needs to retransmit one DTU. Thus, by using this system 900, higher level protocols can potentially reduce the number of retransmission requests and delay from what was previously achievable.

Figure 12:
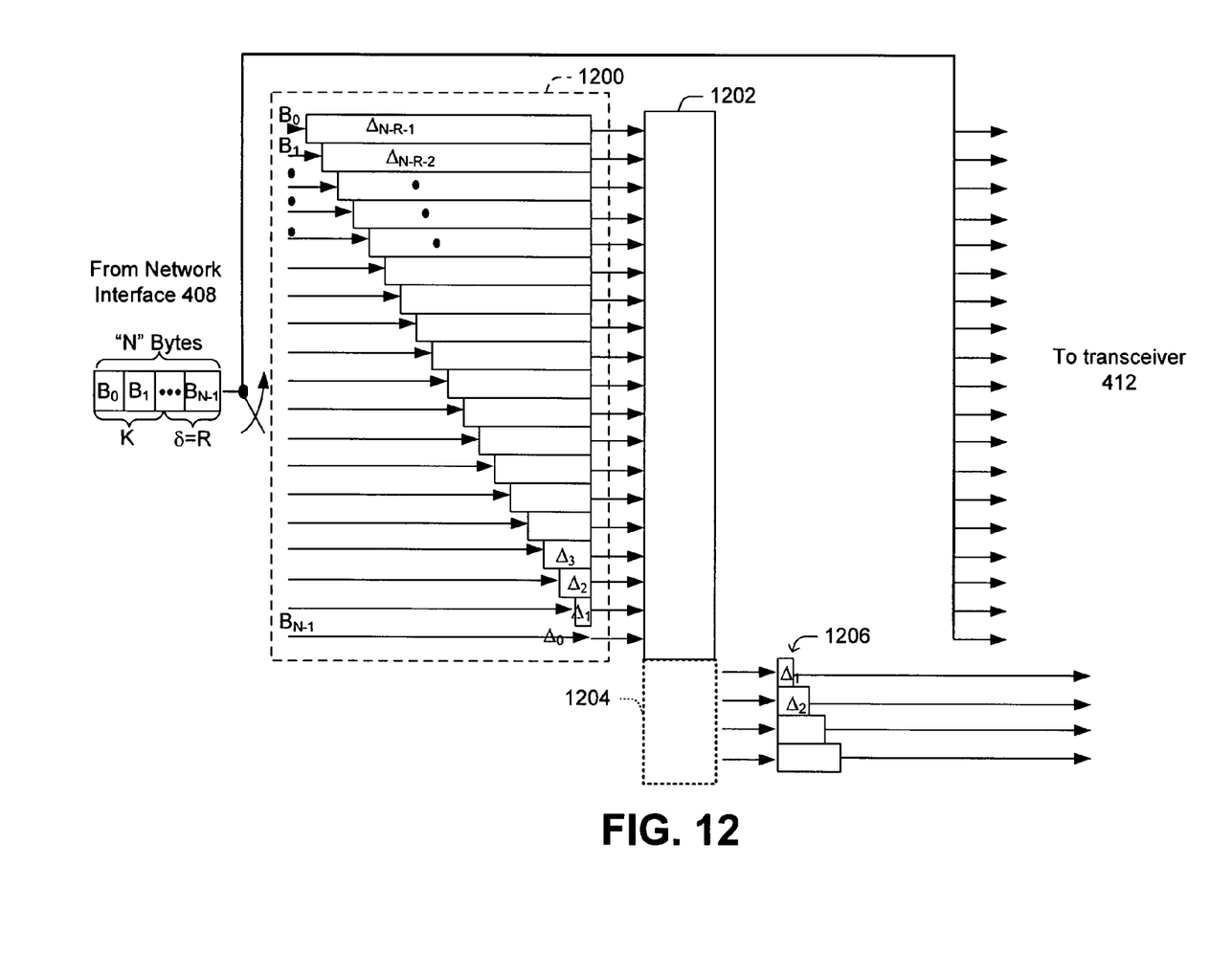
FIG. 12 is an embodiment in which payload data is passed through for transmission onto the transmission medium with effectively zero delay.

FIG. 12 shows a more detailed example of a somewhat optimized interleaving redundancy encoder 906. In FIG. 12, the initial data stream from the network interface 408 is passed directly to the transceiver 412, where Trellis encoding, IFFT, etc., can be used to modulate the outgoing data stream onto the transmission medium 406. Thus, the DTUs transmitted as symbols on the transmission medium could have the same order as presented on the transmitting network interface. Because the payload does not pass through the FIFOs before reaching the transceiver, the payload delay is effectively reduced to zero.

Nonetheless, in one embodiment the payload bytes could still be processed by a pre-interleaver 1200 to form a virtual data stream. A redundancy encoder 1202 will calculate redundancy bytes 1204 based on a series of bytes in the virtual data stream, thereby forming virtual codewords. As shown, in this configuration, the remaining interleaver 1206 only interleaves the redundancy bytes and not the entire virtual codeword. Because the redundancy bytes generally comprise only a fraction of the entire virtual codeword, one of ordinary skill in the art will appreciate that this configuration consumes less memory and may introduce less delay than previously discussed embodiments.

Figure 13:
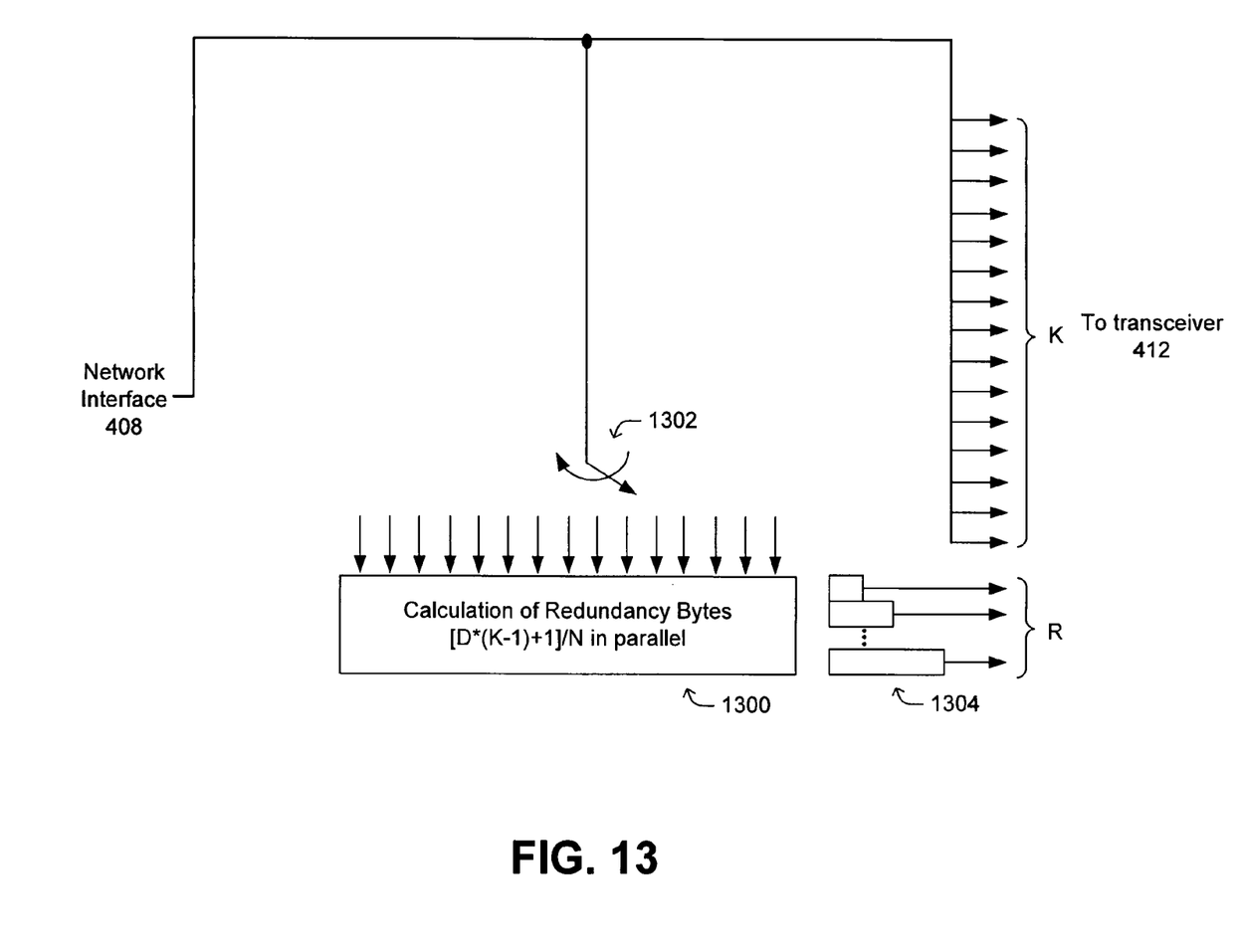
FIG. 13 is another embodiment in which payload data is passed through for transmission onto the transmission medium with effectively zero delay.

FIG. 13 shows still another embodiment where the pre-interleaver 424 and redundancy encoder 426 are replaced by a parallel redundancy block 1300 that calculates the redundancy bytes in parallel. Again the redundancy bytes could be interleaved 1302 as shown. Notably, the initial or modified data stream is passed directly from the network interface 408 to the transceiver 412 for transmission onto the transmission medium. Thus, the symbols on the transmission medium will carry the payload data in the same order as it was received at the network interface with a zero effective delay. In order to calculate suitable redundancy bytes, a controller 1304 sequentially puts the bytes of the data stream into the parallel redundancy block 1300. The controller 1304 places each byte so that bytes that would have been pre-interleaved are now associated with one another for the calculation of the redundancy bytes. In other words, the redundancy bytes could be calculated from a series of bytes derived from a number of DTUs.

Although the invention has been illustrated and described with respect to one or more implementations, alterations and/or modifications may be made to the illustrated examples without departing from the spirit and scope of the appended claims. For example, although the output data stream may be described as being in "the same order" as the initial data stream, it will be appreciated that this term includes data that is in a similar order. For example, although the endianess of the bytes is shown as the same between the transmitting network interface and the transmission medium, the endianness of the bytes could be flipped. In addition, other modifications to the ordering of the data could be made.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A network device, comprising:
    a network interface configured to receive an initial data stream;
    an interleaving redundancy encoder configured to select a series of bytes having a total byte length from the initial data stream, the series of bytes having a span in the initial data stream that is greater than the total byte length, and further configured to calculate at least one redundancy byte based on the series of bytes, where the series of bytes and the at least one redundancy byte are associated with a virtual codeword.

2. The network device of claim 1, further comprising:
    a transmitter configured to transmit an output data stream over a transmission medium, where the output data stream includes the initial data stream with the at least one redundancy byte inserted therein and where consecutive bytes in the output data stream have an order that corresponds to an order of consecutive bytes in the initial data stream.

3. The network device of claim 2, where the initial data stream passes from the network interface to the transmitter with approximately zero effective delay.

4. The network device of claim 1, further comprising:
    a transmitter configured to transmit an output data stream as a series of symbols over the transmission medium, where a symbol is framed to correspond to the size of the virtual codeword.

5. The network device of claim 4, where the output data stream includes the initial data stream with the at least one redundancy byte included therein and where consecutive bytes in the output data stream have an order that corresponds to an order of consecutive bytes in the initial data stream.

6. The network device of claim 1, where the network device is a DSL modem.

7. A network device adapted to facilitate transmission of data over a transmission medium, comprising:
a network interface configured to receive an initial data stream;
a pre-interleaver configured to select a series of equally spaced, non-consecutive bytes from the initial data stream or a modified data stream; and
a redundancy encoder configured to calculate at least one redundancy byte based on the series of bytes, where the series of bytes and the at least one redundancy byte are associated with a virtual codeword.

8. The network device of claim 7, further comprising:
a transmitter configured to transmit an output data stream over the transmission medium, where consecutive bytes in the output data stream have an order that corresponds to an order of consecutive bytes in the initial data stream.

9. The network device of claim 8, where payload data of the initial data stream passes from the network interface to the transmitter with approximately zero effective delay.

10. The network device of claim 7, further comprising:
an interleaver configured to re-order the modified data stream to form an output data stream for transmission over a transmission medium, where consecutive bytes in the output data stream have an order that corresponds to an order of consecutive bytes in the initial data stream.

11. The network device of claim 7, further comprising:
a controller for selectively inserting at least one delay unit into the initial data stream to form the modified data stream.

12. The network device of claim 11, where the series comprises equally spaced, non-consecutive bytes in the modified data stream.

13. The network device of claim 11, where the equal spacing is approximately equal to a number of delay elements in the pre-interleaver.

14. A network device adapted to facilitate transmission of data over a transmission medium, comprising:
a pre-interleaver configured to interleave a plurality of data transmission units according to a pre-interleaving algorithm, thereby generating a multi-bit output result;
a redundancy encoder configured to generate one or more redundancy bytes based on the multi-bit output result, and combine the one or more redundancy bytes with the multi-bit output result to form a virtual codeword; and
an interleaver configured to interleave the codeword according to an interleaving algorithm, and output interleaved data for transmission along the transmission medium.

15. The network device of claim 14, wherein the pre-interleaver is configured to incrementally delay the incoming data bytes according to:

$$\Delta(j)=(D-1)\times(N-j-1); j=0, 1, \ldots (N-1),$$

wherein $\Delta(j)$ comprises the delay associated with the $j^{th}$ byte, D comprises a depth of the pre-interleaver, and N comprises a length of incoming data bytes corresponding to a codeword length.

16. The network device of claim 14, wherein the pre-interleaver is further configured to receive one or more dummy bytes associated with the one or more redundancy bytes, and wherein the dummy bytes are appended to the data transmission units to form a modified data stream having a length associated with the virtual codeword.

17. The network device of claim 14, wherein the redundancy encoder is configured to ignore the dummy bytes when generating the one or more redundancy bytes.

18. The network device of claim 17, wherein the interleaver is configured to interleave the codeword with other codewords by delaying each byte of the codeword according to:

$$\Delta(j)=(D-1)\times j; j=0, 1, \ldots (N-1),$$

wherein $\Delta(j)$ comprises the delay associated with the $j^{th}$ byte, D comprises a depth of the pre-interleaver, and N comprises a length of incoming data bytes corresponding to a codeword length.

19. A method of data processing for communication, comprising:
re-structuring an initial data stream to form a modified data stream;
selecting a series of equally spaced, non-consecutive bytes in the modified data stream;
calculating at least one redundancy byte based on the series of bytes;
associating the at least one redundancy byte with the series of bytes to form a virtual codeword; and
inserting the at least one redundancy byte into the modified data stream to form an outgoing data stream, where consecutive bytes in the outgoing data stream have an order that corresponds to an order of consecutive bytes in the initial data stream.

20. The method of claim 19, further comprising:
transmitting the data in the outgoing data stream over a transmission medium.

21. The method of claim 19, further comprising:
framing the outgoing data stream as a series of symbols, where a symbol is framed to correspond to a size of the virtual codeword.

22. The method of claim 21, further comprising:
transmitting the series of symbols over a transmission medium.

23. A method of data processing for communication, comprising:
receiving an initial data stream;
selecting a series of bytes having a total byte length from the initial data stream, the series of bytes having a span in the initial data stream that is greater than the total byte length;
calculating at least one redundancy byte based on the series of bytes;
associating the at least one redundancy byte with the series of bytes to form a virtual codeword; and
forming an outgoing data stream that includes the initial data stream with the at least one redundancy byte inserted therein, where consecutive bytes in the outgoing data stream have an order that corresponds to an order of consecutive bytes in the initial data stream.

* * * * *